United States Patent [19]

Mardkha

[11] 4,438,352
[45] Mar. 20, 1984

[54] TTL COMPATIBLE CMOS INPUT BUFFER

[75] Inventor: Michael M. Mardkha, Santa Monica, Calif.

[73] Assignee: Xerox Corporation, Stamford, Conn.

[21] Appl. No.: 408,579

[22] Filed: Aug. 17, 1982

Related U.S. Application Data

[63] Continuation-in-part of Ser. No. 155,721, Jun. 2, 1980, abandoned.

[51] Int. Cl.³ ............... H03K 19/003; H03K 19/092; H03K 19/094; H03K 5/02
[52] U.S. Cl. .................................. 307/475; 307/443; 307/451
[58] Field of Search ............... 307/443, 446, 451, 475, 307/270, 264

[56] References Cited

U.S. PATENT DOCUMENTS

| | | | |
|---|---|---|---|
| 3,675,144 | 7/1972 | Zuk | 307/475 X |
| 4,295,065 | 10/1981 | Hsieh et al. | 307/475 |
| 4,321,491 | 3/1982 | Atherton et al. | 307/475 |

FOREIGN PATENT DOCUMENTS

| | | | |
|---|---|---|---|
| 2373921 | 7/1978 | France | 307/475 |
| 54-142059 | 11/1979 | Japan | 307/451 |
| 54-142061 | 11/1979 | Japan | 307/451 |
| 54-153539 | 12/1979 | Japan | 307/475 |
| 55-141828 | 11/1980 | Japan | 307/451 |

OTHER PUBLICATIONS

Dingwall, "TTL-to-CMOS Buffer Circuit"; RCA Technical Notes; TN No.: 1114, 3 pp., 6/1975.

*Primary Examiner*—Larry N. Anagnos
*Attorney, Agent, or Firm*—Robert E. Cunha

[57] ABSTRACT

A circuit for converting a digital signal from TTL to CMOS levels. The circuit delay is reduced by providing a transmission gate between the P and N type transistors in the first stage. This transmission gate has a high impedance during transistions and a low impedance during steady state conditions. In operation, for a rising input signal, the first stage transistors are isolated, allowing the first stage N type transistor to pull down the first stage output line without delay.

3 Claims, 9 Drawing Figures

TABLE OF CMOS MODLE PARAMETERS *

| | TYPE | NMOS | PMOS |
|---|---|---|---|
| THRESHOLD VOLTAGE | (VTO) | 1.100 | -.900 |
| GAIN FACTOR | (KP) | 1.13D-05 | 4.30D-06 |
| FERMI POTENTIAL | (PHI) | .600 | .720 |
| DRAIN RESISTANCE | (RD) | 10.000 | 25.000 |
| SOURCE RESISTANCE | (RS) | 10.000 | 25.000 |
| CAPACITANCE (GATE-TO-DRAIN) | (CGD) | 1.80D-12 | 1.30D-12 |
| CAPACITANCE (GATE-TO-SOURCE) | (CGS) | 1.80D-12 | 1.30D-12 |
| CAPACITANCE (GATE-TO-BODY) | (CGB) | 8.50D-12 | 8.50D-12 |
| CAPACITANCE (BODY-TO-DRAIN) | (CBD) | 1.30D-11 | 4.30D-11 |
| CAPACITANCE (BODY-TO-SOURCE) | (CBS) | 1.30D-11 | 4.30D-11 |
| THICKNESS GATE OXIDE | (TOX) | 8.00D-06 | 8.00D-06 |
| BULK POTENTIAL | PB | .850 | .910 |
| MOBILITY | (UO) | 500.000 | 190.000 |

* E. G., D-12 EQUALS $10^{-12}$

FIG. 7

TABLE OF DC TRANSFER CURVES *

| V(a) | V(b) | V(c) | V(d) | I(cc) |
|---|---|---|---|---|
| 0.000D-00 | 5.000D 00 | 5.000D 00 | 6.335D-08 | -2.773D-11 |
| 2.000D-01 | 5.000D 00 | 5.000D 00 | 6.335D-08 | -2.773D-11 |
| 4.000D-01 | 5.000D 00 | 5.000D 00 | 6.335D-08 | -2.773D-11 |
| 6.000D-01 | 5.000D 00 | 5.000D 00 | 6.335D-08 | -2.773D-11 |
| 8.000D-01 | 5.000D 00 | 5.000D 00 | 6.335D-08 | -2.773D-11 |
| 1.000D-00 | 5.000D 00 | 5.000D 00 | 6.335D-08 | -2.773D-11 |
| 1.200D-00 | 4.995D 00 | 4.983D 00 | 6.362D-08 | -2.813D-07 |
| 1.400D 00 | 4.949D 00 | 4.835D 00 | 6.614D-08 | -2.531D-06 |
| 1.600D 00 | 4.842D 00 | 4.462D 00 | 7.346D-08 | -7.029D-06 |
| 1.800D 00 | 4.647D 00 | 3.466D 00 | 9.480D-02 | -1.995D-05 |
| 2.000D 00 | 4.566D 00 | 3.754D-01 | 5.000D 00 | -1.503D-05 |
| 2.200D 00 | 4.484D 00 | 2.908D-01 | 5.000D 00 | -1.560D-05 |
| 2.400D 00 | 4.330D 00 | 2.556D-01 | 5.000D 00 | -1.683D-05 |
| 2.600D 00 | 3.964D 00 | 2.418S-01 | 5.000D 00 | -1.873D-05 |
| 2.800D 00 | 7.243D 00 | 1.717D-01 | 5.000D 00 | -1.556D-05 |
| 3.000D 00 | 4.095D-01 | 1.075D-01 | 5.000D 00 | -1.114D-05 |
| 3.200D 00 | 2.344D-01 | 6.229D-02 | 5.000D 00 | -7.461D-06 |
| 3.400D 00 | 1.257D-01 | 3.525D-02 | 5.000D 00 | -4.514D-06 |
| 3.600D 00 | 5.809D-02 | 1.648D-02 | 5.000D 00 | -2.303D-06 |
| 3.800D 00 | 1.921D-02 | 5.482D-03 | 5.000D 00 | -8.292D-07 |
| 4.000D 00 | 1.982D-03 | 5.669D-04 | 5.000D 00 | -9.217D-08 |
| 4.200D 00 | 3.186D-07 | 1.197D-07 | 5.000D 00 | -2.773D-11 |
| 4.400D 00 | 2.995D-07 | 1.129D-07 | 5.000D 00 | -2.773D-11 |
| 4.600D 00 | 2.824D-07 | 1.061D-07 | 5.000D 00 | -2.773D-11 |
| 4.800D 00 | 2.672D-07 | 1.004D-07 | 5.000D 00 | -2.773D-11 |
| 5.000D 00 | 2.535D-07 | 9.523D-08 | 5.000D 00 | -2.773D-11 |

* E.G., D-11 EQUALS $10^{-11}$

FIG. 8

TABLE OF TRANSIENT ANALYSIS *

| TIME (SEC) | V(a) | V(b) | V(c) | V(d) |
|---|---|---|---|---|
| 0.000D-00 | 8.000D-01 | 5.000D 00 | 5.000D 00 | 6.335D-08 |
| 2.000D-09 | 8.000D-01 | 5.000D 00 | 5.000D 00 | -1.085D-06 |
| 4.000D-09 | 8.000D-01 | 5.000D 00 | 5.000D 00 | -1.287D-06 |
| 6.000D-09 | 8.000D-01 | 5.000D 00 | 5.000D 00 | -6.253D-07 |
| 8.000D-09 | 8.000D-01 | 5.000D 00 | 5.000D 00 | -9.290D-08 |
| 1.000D-08 | 8.000D-01 | 5.000D 00 | 5.000D 00 | 2.842D-07 |
| 1.200D-08 | 1.120D 00 | 5.075D 00 | 5.072D 00 | 2.309D-03 |
| 1.400D-08 | 1.440D 00 | 5.092D 00 | 5.099D 00 | 1.965D-03 |
| 1.600D-08 | 1.760D 00 | 5.080D 00 | 5.006D 00 | -2.165D-03 |
| 1.800D-08 | 2.080D 00 | 5.019D 00 | 4.699D 00 | -1.148D-02 |
| 2.000D-08 | 2.400D 00 | 4.916D 00 | 4.010D 00 | -3.055D-02 |
| 2.200D-08 | 2.400D 00 | 4.721D 00 | 2.935D 00 | -1.453D-02 |
| 2.400D-08 | 2.400D 00 | 4.703D 00 | 1.834D 00 | 2.401D-01 |
| 2.600D-08 | 2.400D 00 | 4.680D 00 | 9.287D-01 | 9.681D-01 |
| 2.800D-08 | 2.400D 00 | 4.568D 00 | 4.929D-01 | 2.093D 00 |
| 3.000D-08 | 2.400D 00 | 4.470D 00 | 4.193D-01 | 3.190D 00 |
| 3.200D-08 | 2.400D 00 | 4.439D 00 | 3.872D-01 | 3.979D 00 |
| 3.400D-08 | 2.400D 00 | 4.416D 00 | 3.476D-01 | 4.463D 00 |
| 3.600D-08 | 2.400D 00 | 4.389D 00 | 3.116D-01 | 4.730D 00 |
| 3.800D-08 | 2.400D 00 | 4.366D 00 | 2.866D-01 | 4.868D 00 |
| 4.000D-08 | 2.400D 00 | 4.350D 00 | 2.717D-01 | 4.936D 00 |
| 4.200D-08 | 2.400D 00 | 4.340D 00 | 2.673D-01 | 4.969D 00 |
| 4.400D-08 | 2.400D 00 | 4.335D 00 | 2.595D-01 | 4.985D 00 |
| 4.600D-08 | 2.400D 00 | 4.333D 00 | 2.575D-01 | 4.993D 00 |
| 4.800D-08 | 2.400D 00 | 4.331D 00 | 2.565D-01 | 4.997D 00 |
| 5.000D-08 | 2.400D 00 | 4.331D 00 | 2.560D-01 | 4.998D 00 |
| 5.200D-08 | 2.400D 00 | 4.330D 00 | 2.558D-01 | 4.999D 00 |
| 5.400D-08 | 2.400D 00 | 4.330D 00 | 2.557D-01 | 5.000D 00 |
| 5.600D-08 | 2.240D 00 | 4.265D 00 | 2.134D-01 | 4.997D 00 |
| 5.800D-08 | 1.920D 00 | 4.367D 00 | 1.917D-01 | 4.998D 00 |
| 6.000D-08 | 1.600D 00 | 4.452D 00 | 2.564D-01 | 5.002D 00 |
| 6.200D-08 | 1.280D 00 | 4.441D 00 | 5.384D-01 | 5.017D 00 |
| 6.400D-08 | 9.600D 00 | 4.391D 00 | 1.151D 00 | 5.045D 00 |
| 6.600D-08 | 8.000D-00 | 4.422D 00 | 1.947D 00 | 5.057D 00 |
| 6.800D-08 | 8.000D-00 | 4.467D 00 | 2.684D 00 | 4.967D 00 |
| 7.000D-08 | 8.000D-00 | 4.545D 00 | 3.262D 00 | 4.718D 00 |
| 7.200D-08 | 8.000D-00 | 4.639D 00 | 3.470D 00 | 4.245D 00 |
| 7.400D-08 | 8.000D-00 | 4.735D 00 | 4.138D 00 | 3.516D 00 |
| 7.600D-08 | 8.000D-00 | 4.806D 00 | 4.373D 00 | 2.629D 00 |
| 7.800D-08 | 8.000D-00 | 4.845D 00 | 4.504D 00 | 1.765D 00 |
| 8.000D-08 | 8.000D-00 | 4.874D 00 | 4.600D 00 | 1.080D 00 |
| 8.200D-08 | 8.000D-00 | 4.898D 00 | 4.683D 00 | 6.146D-01 |
| 8.400D-08 | 8.000D-00 | 4.921D 00 | 4.756D 00 | 3.326D-01 |
| 8.600D-08 | 8.000D-00 | 4.940D 00 | 4.818D 00 | 1.743D-01 |
| 8.800D-08 | 8.000D-00 | 4.956D 00 | 4.868D 00 | 8.982D-02 |
| 9.000D-08 | 8.000D-00 | 4.969D 00 | 4.907D 00 | 4.600D-02 |
| 9.200D-08 | 8.000D-00 | 4.970D 00 | 4.936D 00 | 2.361D-02 |
| 9.400D-08 | 8.000D-00 | 4.985D 00 | 4.956D 00 | 1.223D-02 |
| 9.600D-08 | 8.000D-00 | 4.990D 00 | 4.970D 00 | 6.431D-03 |
| 9.800D-08 | 8.000D-00 | 4.993D 00 | 4.980D 00 | 3.449D-03 |
| 1.000D-07 | 8.000D-00 | 4.995D 00 | 4.986D 00 | 1.913D-03 |

* E.G., D-01 EQUALS $10^{-1}$

*FIG. 9*

TTL COMPATIBLE CMOS INPUT BUFFER

BACKGROUND OF THE INVENTION

This is a continuation-in-part of a copending patent application, "A TTL Compatible CMOS Input Buffer", Ser. No. 155,721, filed June 2, 1980 and now abandoned.

This invention relates to TTL compatible CMOS input buffer devices.

In the past, one of the problems with interfacing CMOS logic to TTL logic was the difference in the output level of the TTL output driver and the guaranteed noise immunity of CMOS input buffer circuits as shown in FIG. 1. The output voltage for TTL circuits is guaranteed to be 0.8 v for a low output ($V_{OL}$) and 2.4 v for a high output ($V_{OH}$), with power supply voltage (Vcc) between 5.5 and 4.5 volts. The CMOS input has no problem with an input of 0.8 v because the input low voltage ($V_{IL}$) is normally 30% of Vcc or roughly 1.5 v, but the input high voltage ($V_{IH}$) is normally 70% of Vcc or about 3.5 volts. Obviously, the $V_{OH}$ of TTL is not sufficient to meet the normal CMOS $V_{IH}$ specification.

There are several ways to correct this problem. One way is by using a pull-up resistor at the input of the CMOS device to pull up the input high voltage, but this method has a few problems. One is that with a pull up resistor there is a dc current loop from Vcc to ground whenever the TTL device's output is low, as shown in FIG. 2, and this defeats the purpose of using CMOS. Another problem is that the addition of a resistor increases device count on the board, consumes space and increases cost. The resistor can be fabricated on the chip but it will draw too much current in a CMOS environment and hence is unacceptable to CMOS users.

Another way of correcting this problem is to reduce the $V_{IH}$ of the CMOS input to trigger at 2.4 v. To accomplish this, the device ratios for the P and N channel transistors have to be altered. The normal device ratio in CMOS depends on the $K_P$ and $K_N$ (gain factors). Generally, $K_N$ is about three times that of $K_P$ in a polysilicon gate bulk CMOS process. This means that if channel lengths are the same for both P and N devices, then to have comparable rise and fall times at the output, the width of the P device has to be three times that of the N device (this ratio results in an input trigger voltage of about $V_{IH}=3.0$ v). To reduce the $V_{IH}$ to 2.4 v, the N channel device drive must be increased relative to the P channel device or the width of the N device has to increase (assuming the device lengths are kept comparable). This mismatch in device ratios affects the speed and the output rise and fall times of this buffer such that the fall time is much faster than the rise time. To reduce the mismatch in output drive, another mismatched stage is used at the output of the first stage, see FIG. 3. Now, the difference in rise and fall time is not as large but the added delay due to slow rise time of the first stage remains.

Accordingly, it is an object of the invention to provide a TTL compatible CMOS input buffer with minimal voltage mismatching at the interface for lowered power consumption and improved rise-fall times for minimal time delays.

It is a further object of the invention to provide spatially constrained layout dimensions as a result of the smaller transistors utilized in a lowered power consumption environment.

It is another object of the invention to provide a transmission gate between the P and N devices of the first stage operative to act as a variable impedance whose value is controlled by the input to the buffer.

It is another object of the invention to provide a transmission gate that is a pair of transistors.

Various other objects, advantages and meritorious features of the invention will become apparent from the following specification, appended claims and accompanying drawing sheets.

The features of a specific embodiment of the invention are illustrated in the drawings in which:

FIG. 7 is a table of CMOS MOSFET model parameters for the TTL compatible CMOS input buffer of FIG. 4.

FIG. 8 is a table of DC transfer curves for the TTL compatible CMOS input buffer of FIG. 4.

FIG. 9 is a table of transient analysis for the TTL compatible CMOS input buffer of FIG. 4.

Referring particularly to FIGS. 1 through 9 of the drawings by the characters of reference, there is illustrated a TTL compatible CMOS input buffer for carrying out the objects of the invention.

Figure 1:
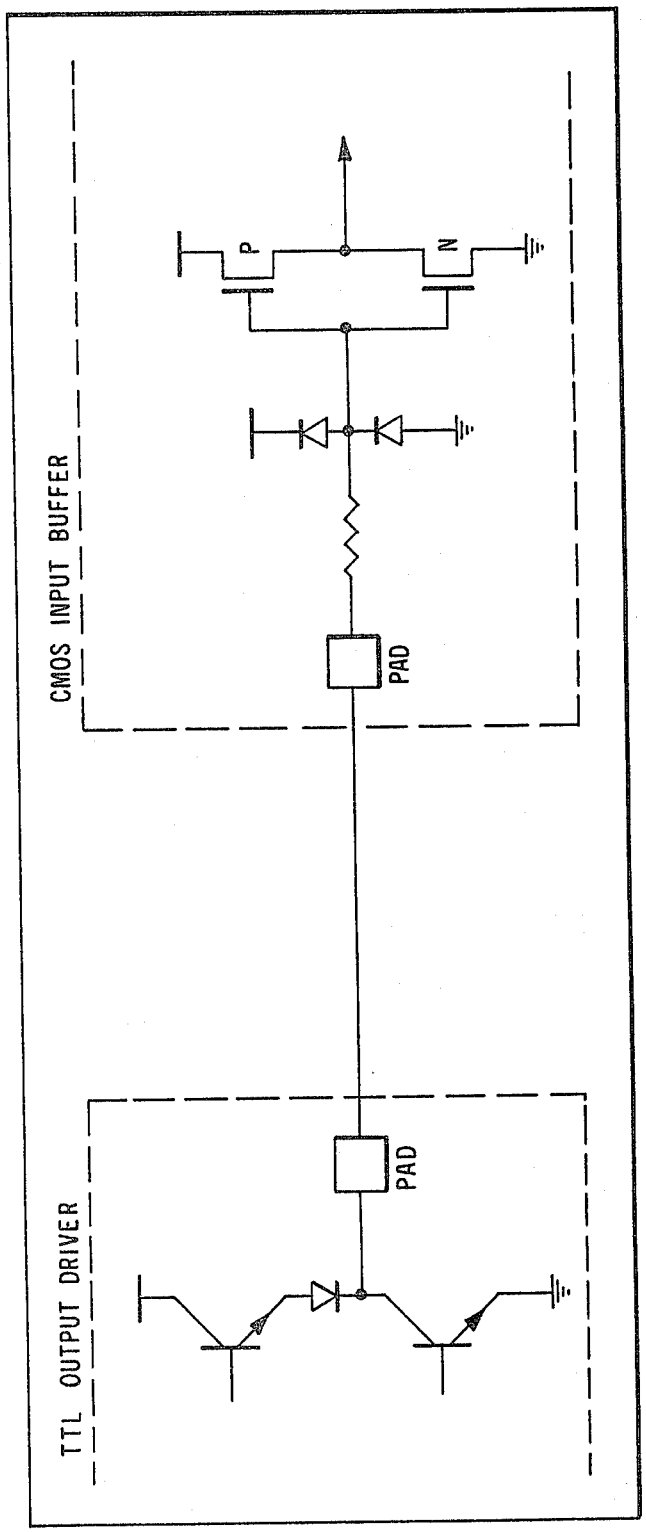
FIG. 1 shows a prior art interface between a TTL output driver and a CMOS input buffer that is mismatched without buffering.
Figure 2:
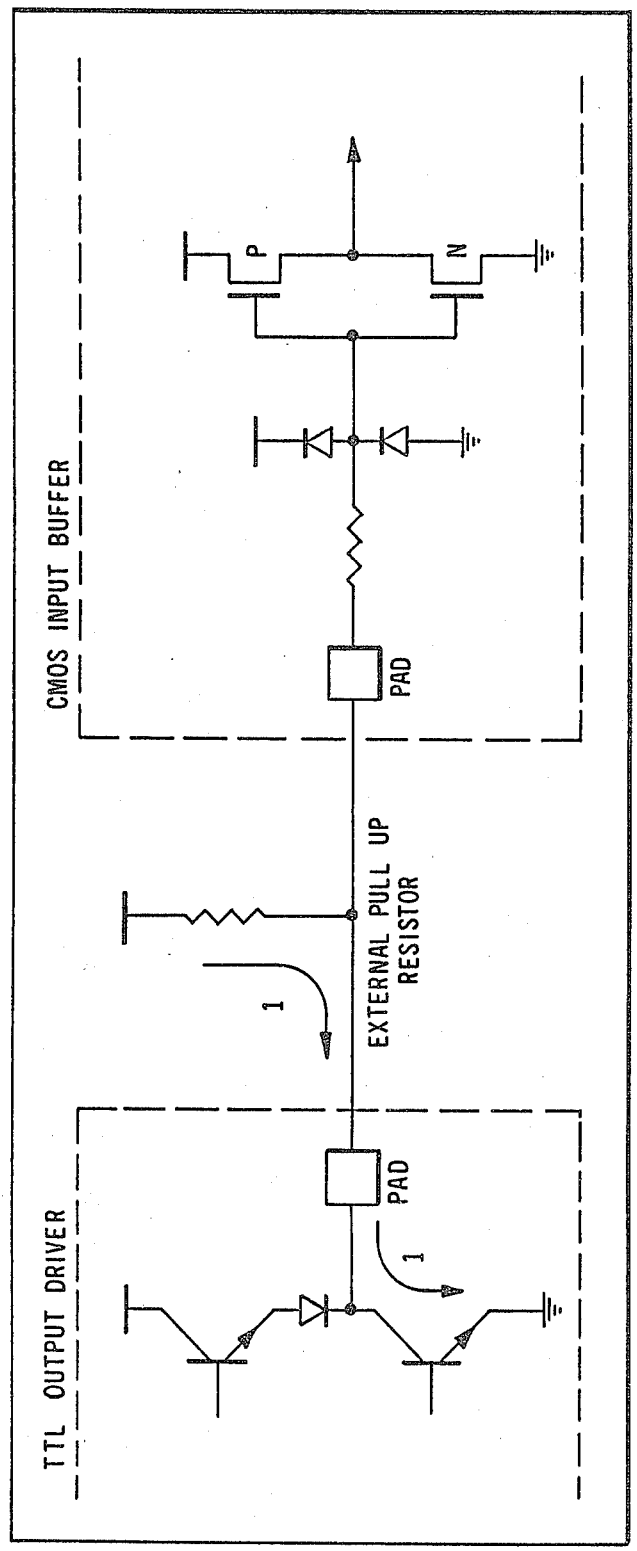
FIG. 2 shows a prior art interface between a TTL output driver and a CMOS input buffer that is mismatched but buffered by an external pull-up resistor.
Figure 3:
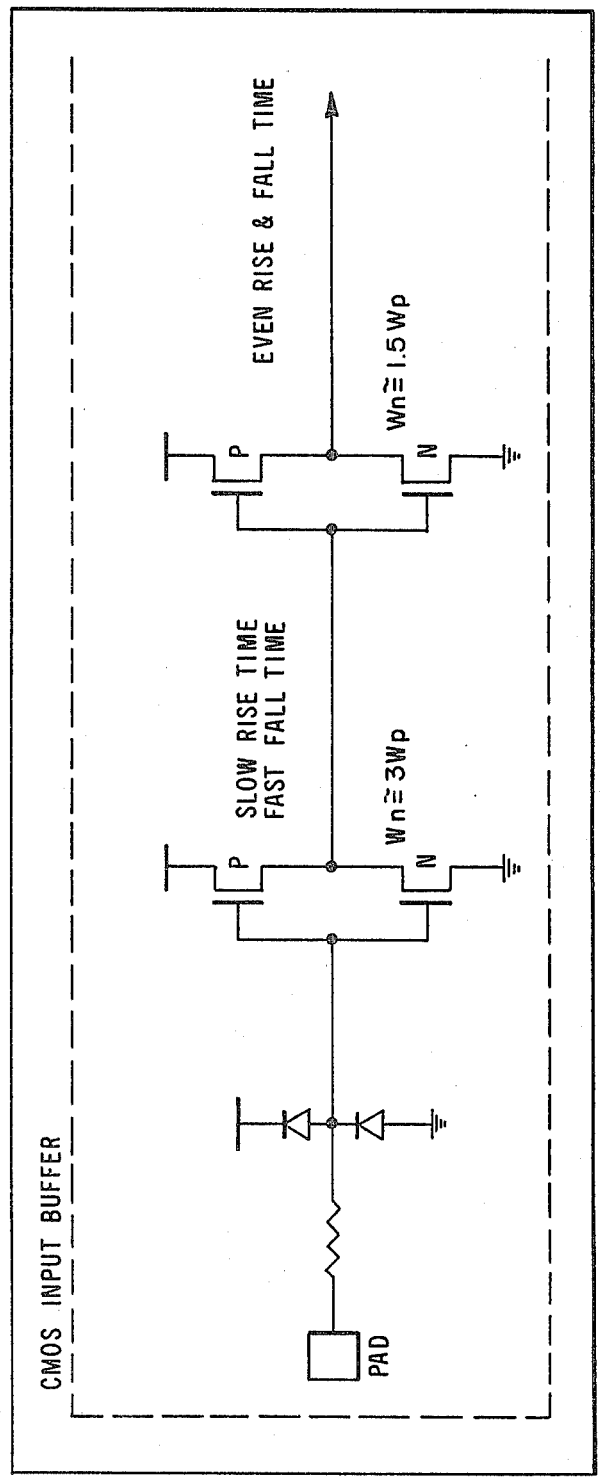
FIG. 3 shows a prior art CMOS input buffer interfacing with a TTL output driver that is mismatched but buffered by an extra stage of P and N devices.
Figure 4:
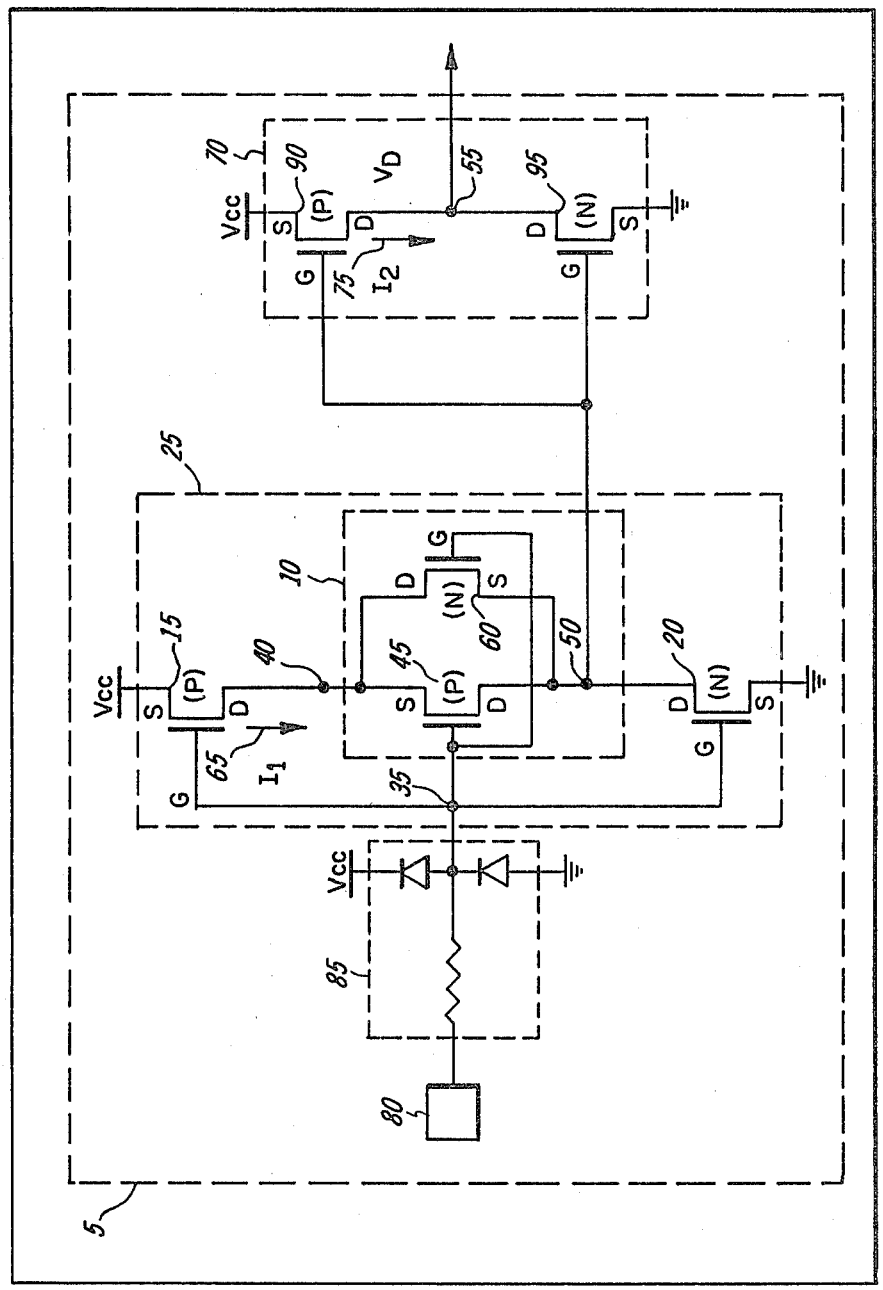
FIG. 4 shows, in schematic form, the TTL compatible CMOS input buffer of the present invention with a transmission gate in the first stage having controlled variable impedance.

The schematic diagram of the circuit is shown in FIG. 4. The input signal, which switches between the TTL levels of 0.8 and 2.4 volts is applied to input pad 80, and is coupled through a diode circuit 85 for limiting voltage transients to the input terminal 35 of the first stage buffer 25.

This first stage 25 comprises a P type MOS transistor 15 which receives the input signal at its gate G, and is also connected by its source S to $V_{cc}$ and by its drain D to the transmission gate 10. This first stage also comprises an N type MOS transistor 20 which receives the same input signal at its gate G, and is connected to ground by its source S and to the transmission gate 10 by its drain D.

When a low TTL signal level of 0.8 volts is applied through the diode network 85 to point 35 and to the gates G of transistors 15 and 20, the N type transistor 20 will cut off and the P type transistor 15 will conduct, resulting in a high output at point 50. Similarly, a high input of 2.4 volts at point 35 will result in a low output at point 50. To speed up this transition, a transmission gate 10 is added to the circuit between transistors 15 and 20.

The purpose of this gate 10 is to isolate transistor 20 during transition, and any variable impedance that can be designed to have a high impedance during transitions, and a low impedance for steady state conditions may be used here.

The particular transmission gate used in this circuit is the arrangement shown, a P type MOS transistor and an N type MOS transistor connected in parallel. Using this arrangement, when a typical TTL low level signal of 0.8 volts is applied to point 35, and therefore, to the gates of P type transistors 15 and 45, both will conduct. In this mode, the impedance of the transmission gate is low due to the conduction of transistor 45. However, as the input voltage at point 35 rises to 2.4 volts, and as transistor 20 starts to conduct, transmission gate transistor 45 cuts off. At the same time, the transmission gate N type transistor 60 has not yet started to conduct. The result is a high impedance between the drains D of transistors 15 and 20. In this mode, as transistor 20 starts to conduct, it sees a high load impedance, and pulls down the voltage at point 50 with a minimum of delay.

The second stage is an ordinary CMOS inverting buffer operating at standard CMOS voltage levels. A high input signal at point 50 turns N type transistor 95 on and P type transistor 90 off resulting in a low output at point 55. Similarly, a low input results in a high output.

Figure 5:
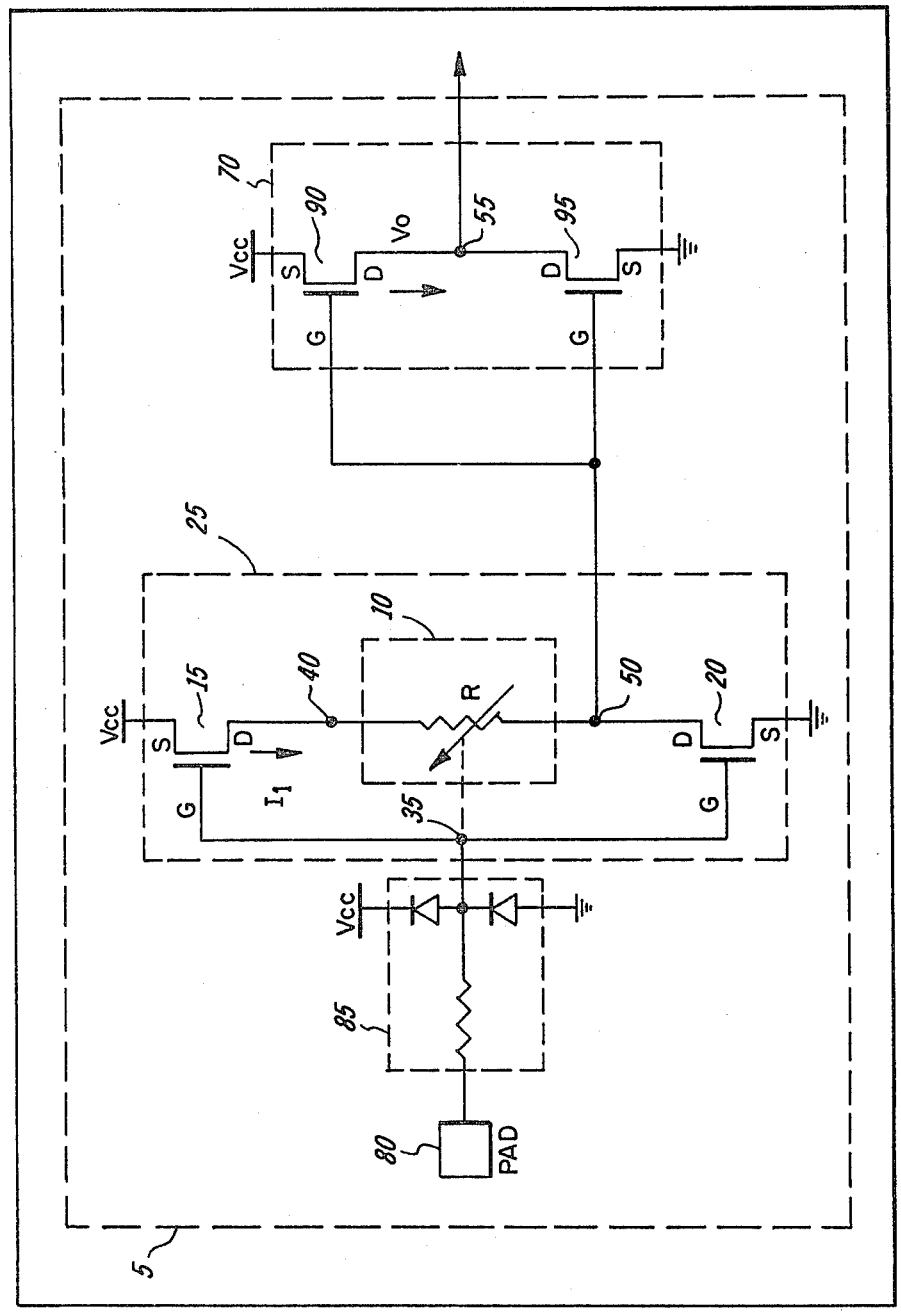
FIG. 5 shows, in equivalent circuit form, the TTL compatible CMOS input buffer of the present invention of FIG. 4 with a transmission gate in the first stage having controlled variable impedance.

FIG. 5 is the equivalent diagram showing the transmission gate 10 as a variable impedance. As explained, the impedance is higher during transition between low and high inputs.

Figure 6:
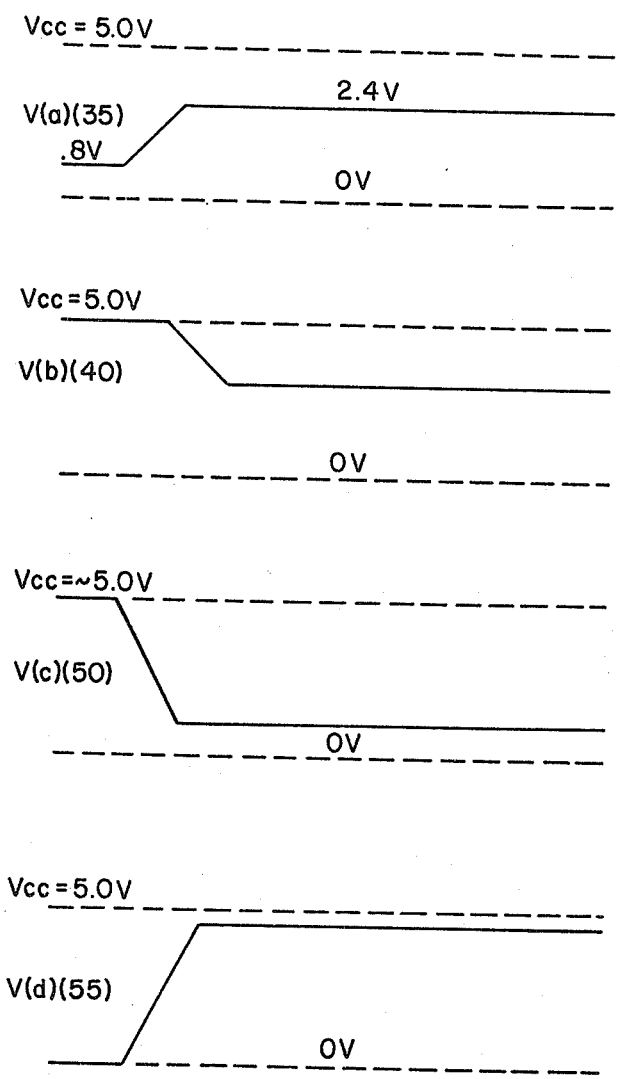
FIG. 6 shows a timing diagram for the TTL compatible CMOS input buffer of the present invention of FIGS. 4 and 5.

FIG. 6 is a table of waveshapes which assumes a power supply voltage, $V_{cc}$, of five volts. V(a) is the input signal at point 35 and is shown initially switching from low to high at the TTL levels of 0.8 and 2.4 volts. Almost immediately, the voltage at point 50, $V_c$, starts to go low, in spite of the voltage V(b) at point 40 staying high for a significant delay, because of the isolating action of the transmission gate 10. Finally, the inverted output V(d) at point 55 follows the timing of the original input by a small delay.

The FIG. 7 table is a self-explaining set of electrical parameters of the NMOS and PMOS transistors used in the described embodiment.

The FIG. 8 table is a set of circuit voltages and currents, V(a) at point 35, V(b) at point 40, V(c) at point 50, V(d) at point 55 and I(cc) for the entire circuit. The transition in this table occurs between the 10th and 11th lines. That is, for example, as the input voltage V(a) varies from 0.8 to 2.0 volts, the voltage at point 50, V(c), varies from 3.466 volts to 0.3754 volts ($3.754 \times 10^{-1}$ in the table).

FIG. 9 is a timing table. The output delay when the input goes from 0.8 to 2.4 volts is approximately $14 \times 10^{-9}$ sec.

While the invention has been described with reference to specific embodiments, it will be understood by those skilled in the art that various changes will be made and equivalents may be substituted for elements thereof without departing from the true spirit and scope of the invention. In addition, many modifications may be made without departing from the essential teachings of the invention.

I claim:

1. A TTL compatible CMOS input buffer for converting an input signal at TTL levels to an output signal at CMOS levels comprising:
   a transmission gate coupled to receive said input signal and having a high impedance during input level transitions and a low impedance during steady high and low input signal conditions,
   a first transistor connected between said transmission gate and the power supply,
   a second transistor connected between said transmission gate and ground,
   the gates of said first and second transistors connected to said input, and
   third and fourth transistors connected in series between the power supply and ground, the gates of said third and fourth transistors connected to the connection between said second transistor and said transmission gate, the output point of the buffer being the connection point between said third and fourth transistors.

2. The buffer of claim 1 wherein the power supply is positive, the first and third transistors are P-type and the second and fourth are N-type, the sources of the first and third transistors are connected to the power supply, the sources of the second and fourth transistors are grounded, and the drain of the second transistor is connected to the gates of the third and fourth transistors.

3. The buffer of claim 1 wherein said transmission gate comprises a P-type MOS transistor and an N-type transistor, both gates connected to receive said input signal, and where the source of each transistor of said transmission gate is connected to the drain of the other transistor.

* * * * *